United States Patent
Temporiti Milani et al.

(10) Patent No.: US 8,907,729 B2
(45) Date of Patent: Dec. 9, 2014

(54) TRANS-IMPEDANCE AMPLIFIER FOR HIGH SPEED OPTICAL-ELECTRICAL INTERFACES

(71) Applicant: STMicroelectronics S.R.L., Agrate Brianza (IT)

(72) Inventors: Enrico Stefano Temporiti Milani, Pavia (IT); Wissam Yussef Sabri Eyssa, Ceranova (IT); Gabriele Minoia, Pavia (IT)

(73) Assignee: STMicroelectronics S.R.L., Agrate Brianza (MB) (IT)

( * ) Notice: Subject to any disclaimer, the term of this patent is extended or adjusted under 35 U.S.C. 154(b) by 66 days.

(21) Appl. No.: 13/864,739

(22) Filed: Apr. 17, 2013

(65) Prior Publication Data
US 2013/0278338 A1   Oct. 24, 2013

(30) Foreign Application Priority Data
Apr. 18, 2012   (IT) .............................. MI2012A0640

(51) Int. Cl.
*H03F 3/08* (2006.01)

(52) U.S. Cl.
USPC .................. 330/308; 330/259; 250/214 A

(58) Field of Classification Search
USPC ................. 330/308, 259; 250/214 A
See application file for complete search history.

(56) References Cited

U.S. PATENT DOCUMENTS

| | | | | |
|---|---|---|---|---|
| 4,688,268 A * | 8/1987 | Holland | ......................... | 398/209 |
| 5,982,232 A * | 11/1999 | Rogers | ............................. | 330/69 |
| 6,226,136 B1 * | 5/2001 | Chern | ............................. | 360/25 |
| 7,562,581 B2 * | 7/2009 | Garverick et al. | .............. | 73/777 |
| 2008/0197927 A1 * | 8/2008 | Ripley | ......................... | 330/259 |
| 2010/0176279 A1 * | 7/2010 | Lai | .................. | 250/216 |
| 2011/0008060 A1 | 1/2011 | Kucharski | | |
| 2014/0218005 A1 * | 8/2014 | Farris | .......................... | 324/71.2 |

FOREIGN PATENT DOCUMENTS

WO    0011780    3/2000

OTHER PUBLICATIONS

Kurtti et al., "An Integrated Laser Radar Receiver Channel Utilizing a Time-Domain Walk Error Compensation Scheme", IEEE Transactions on Instrumentation and Measurement, vol. 60, No. 1, Jan. 2011, pp. 146-157.

\* cited by examiner

*Primary Examiner* — Patricia Nguyen
(74) *Attorney, Agent, or Firm* — Allen, Dyer, Doppelt, Milbrath & Gilchrist, P.A.

(57) ABSTRACT

The differential trans-impedance amplifier uses trans-resistance(s) connected between the input nodes of a first differential amplifier, to implement a trans-impedance differential amplifier in a differential fashion and has two identical resistances, each connected between the photodiode and a respective DC voltage rail of a common bias network of the photodiode adapted to reverse bias the photodiode. The biasing resistances may be much larger than the trans-resistance(s) to prevent drawing any significant signal current from the photodiode. The amplifier may retain the advantages of a classical differential topology while effectively overcoming drawbacks that arise in high data rate applications.

28 Claims, 2 Drawing Sheets

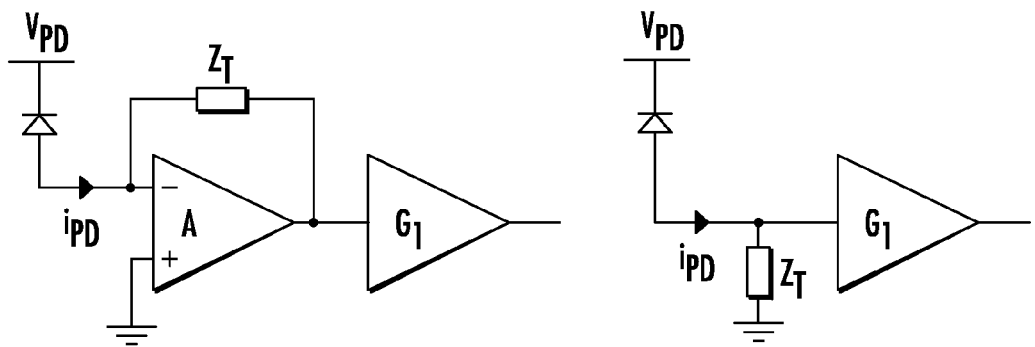
FIG. 1A
(PRIOR ART)
FIG. 1B
(PRIOR ART)
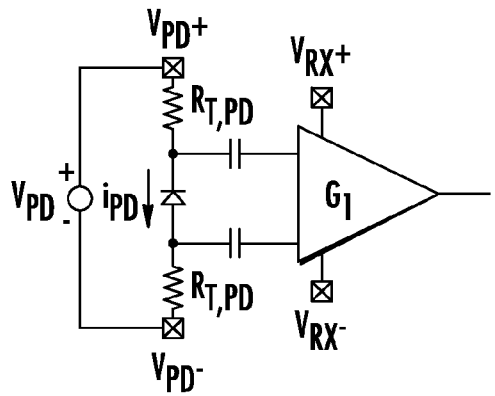
FIG. 2
(PRIOR ART)
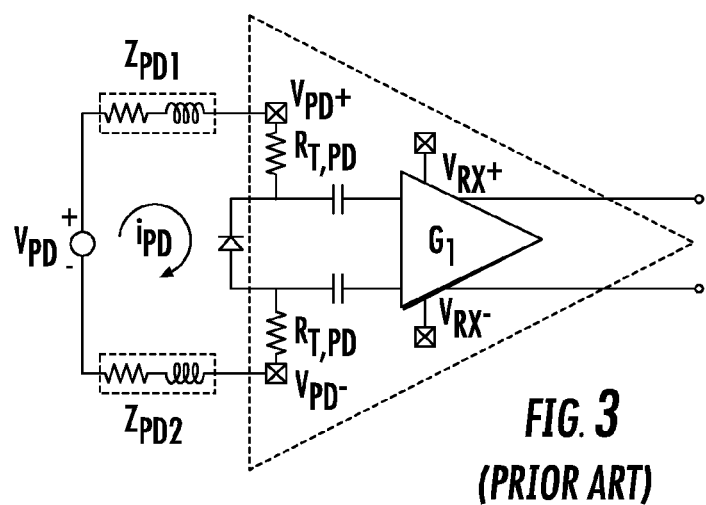
FIG. 3
(PRIOR ART)

TRANS-IMPEDANCE AMPLIFIER FOR HIGH SPEED OPTICAL-ELECTRICAL INTERFACES

FIELD OF THE INVENTION

The invention relates to Optical-Electrical (O-E) interfaces for high speed communications, particularly suitable for silicon photonics applications.

BACKGROUND OF THE INVENTION

Optical-Electrical (O-E) interfaces are used in high speed communication systems to convert the incident light signal into an electrical signal. Typically, the O-E interface is made up of a photodiode (PD), to convert the incident light power into a current, and a Trans-Impedance Amplifier (TIA), to convert the photocurrent into a voltage of large enough amplitude to be managed by the following electronic stages. The TIA is generally followed by additional amplification stages to reach the desired output level and to drive the output load.

The TIA is typically considered an important block in high data rate (DR) applications since it ensures a large analog bandwidth (BW) in order not to degrade the Inter-Symbol Interference (ISI) of the received bit stream but, at the same time, it may desirably have a large enough gain to provide at its output a manageable voltage for the following stages. It should also typically maintain a low integrated noise at its output so as not to degrade the overall Signal-to Noise Ratio (SNR), that directly impacts the output Bit Error Rate (BER).

Two TIA architectures are typically used, the feedback one and the open-loop one. The feedback architecture makes use of an amplifying stage fed back in an inverting configuration and fed at the input by the PD photocurrent iPD (FIG. 1a). The feedback impedance ZT realizes the desired trans-impedance gain. On the other hand, the open-loop architecture realizes the desired trans-impedance gain by injecting the photocurrent directly into an impedance ZT, and uses an open-loop amplifier to increase the voltage level up to the desired level (FIG. 1b).

The feedback architecture is generally preferred in presence of large input capacitances because for a given input sensitivity and a desired BER it provides a larger BW. The advantage in terms of bandwidth (BW) directly depends on the gain A of the amplifying stage (e.g. this advantage can be quantified into a factor sqrt(A+1) in the most simplified model, assuming infinite BW and null output impedance for the amplifying stage). This advantage is achieved at the expense of a more complex architecture, that intrinsically dissipates a larger power, and that may be prone to non idealities and to stability issues. These effects may become more and more important as the data rate increases (typically >10 Gbps) due to high frequency parasitic effects. In addition, a large gain A at frequencies in the range of tens of GHz is generally difficult to achieve, especially in low supply amplifiers, and this may reduce or even nullifies the advantages of a feedback architecture.

To extend data rates beyond 10 Gbps, equalization techniques are typically used, and particularly feed-forward equalization based on inductive peaking (Mohan 2000). The purpose of these techniques is to enlarge the bandwidth of the amplifying stage by emphasizing specific frequency components of the received signal (typically the high frequency components), while maintaining unmodified the other spectral components. Depending on the amount of equalization needed, this operation can be either concentrated into a single stage (typically the TIA) or distributed over several stages of the receiver chain. In most applications a programmable equalization is used, to ensure proper operation and/or uniform performance over Process Voltage and Temperature (PVT) conditions.

FIGS. 1a and 1b show typical TIA topologies with a single-ended PD connection. However, a differential topology has been recently proposed and applied to an open-loop TIA architecture (FIG. 2) (Kucharsky 2010).

This topology may be particularly suitable for silicon photonics applications: in fact, these can make use of a balanced waveguide PD integrated on the same silicon substrate as the electronic circuits (or on a separate silicon substrate, similar to the one used for electronic circuits). A differential topology intrinsically offers two advantages compared to a single-ended one: a 3 dB better SNR and a higher rejection of supply noise. The topology proposed in (Kucharsky 2010) implements the desired trans-resistance using two equal resistances RT, PD, connected to VPD+ and VPD− respectively to properly bias the PD, and AC-coupled to the following stage, as shown in FIG. 2, to allow proper bias of the stage itself (typically implemented by a differential pair). However this topology faces intrinsic limits discussed below, especially when extended to high DR applications.

1) Even if the topology is differential, the PD generated photocurrent is forced over a single-ended path through the two $R_{T,PD}$ trans-resistances before being converted into a differential voltage. This may be undesirable at frequencies in the range of tens of GHz, since the path between VPD+ and VPD− is generally a good short circuit only at low frequencies, but it is not well characterized at frequencies in the range of tens of GHz. This effect can be modeled by two parasitic impedances $Z_{PD1,2}$ in series with $R_{T,PD}$, as shown in FIG. 3.

2) Any undesired noise coupled on the PD supplies can significantly degrade the jitter performance at the TIA output.

3) Any asymmetry in the values of the two $Z_{PD1,2}$ impedances moves the behavior of the circuit far from the ideal balanced one.

4) If the photodiode (PD) is not integrated on the same die of the TIA, this topology may suffer from the parasitic capacitances added at the PD anode/cathode by the interconnects between the PD and the TIA. In particular, this topology may not allow simple implementation of ESD protection (that may be required if the PD is not integrated on the same die of the TIA), without penalizing the BW.

5) The latter issue (4) is hard to address in this topology when implementing a programmable equalization operation joined with the trans-impedance operation. Therefore the equalization operation is carried out in the amplifying stage following the trans-resistance. The reason is that programmable peaking uses active components, that are unavoidably asymmetrically biased due to the asymmetric connection of $R_{T,PD}$ (to $V_{PD}+$ and $V_{PD}-$, respectively). For example, in a CMOS implementation this means that PMOS transistors are used on one branch and NMOS transistors on the other one, and this, in turn, may lead to higher mismatches between the two branches, especially over PVT variations.

SUMMARY OF THE INVENTION

An objective is to address the above identified drawbacks and limitations of an open loop TIA with differential or pseudo-differential circuit topology.

The differential circuit topology of a trans-impedance amplifier as disclosed herein may retain the advantages of a classical differential topology as depicted in the known circuit diagrams of FIGS. 2 and 3, while effectively overcoming the drawbacks discussed above that severely manifest themselves in high data rate (DR) applications. A specific advantage may be that performance is very stable over PVT variations.

Basically the differential trans-impedance amplifier of this disclosure relies on trans-resistance(s) connected between the input nodes of a first differential amplifier, in order to implement a trans-impedance differential amplifier in a truly differential fashion and has two identical biasing resistances (RPD-RPD), each connected between the photodiode and a respective DC voltage rail of a common bias network of the photodiode adapted to reverse bias the photodiode. The biasing resistances may be much larger than the trans-resistance(s) to prevent drawing any significant signal current from the photodiode.

BRIEF DESCRIPTION OF THE DRAWINGS

FIG. 1 shows a typical TIA: (a) in feedback configuration; (b) in open-loop configuration as in the prior art.

FIG. 2 shows a TIA in open-loop configuration and with a differential circuit topology as in the prior art.

FIG. 3 shows an embodiment with two uncharacterized auxiliary series impedances introduced in the PD biasing network of a differential TIA in open-loop configuration as in the prior art.

DETAILED DESCRIPTION OF THE PREFERRED EMBODIMENTS

Figure 4:
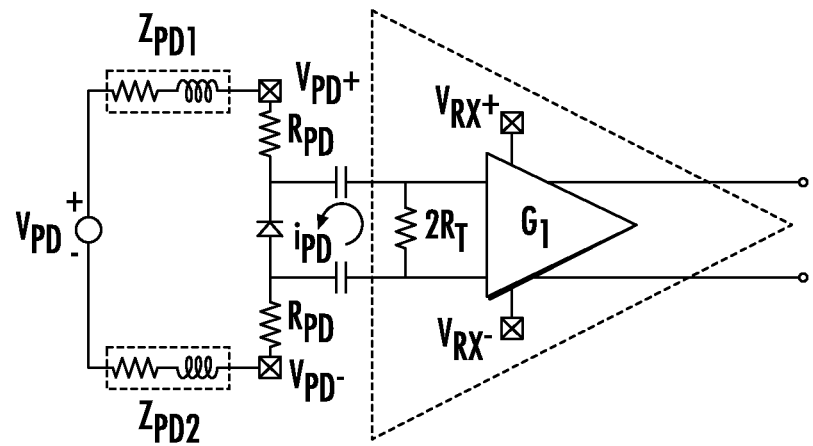
FIG. 4 depicts the basic circuit topology of the differential, open-loop configuration TIA of this invention.

A basic sample embodiment of the differential, open-loop configuration TIA is depicted in FIG. 4. Compared to the known topology of FIG. 3, the photodiode (PD) biasing network is practically decoupled from the trans-resistance amplifier.

Two large value resistors (RPD>>RT), connected to VPD+ and VPD−, respectively, are used to reverse bias the PD without drawing any significant signal current (i.e. without degrading the trans-resistance gain). AC-coupling to the following amplifying circuitry may be used to allow proper biasing of the following stage (typically implemented by a differential input transistor pair). The trans-impedance is implemented in a fully-differential fashion by the trans-resistance(s) 2RT connected between the input nodes of the differential amplifier.

Figure 5:
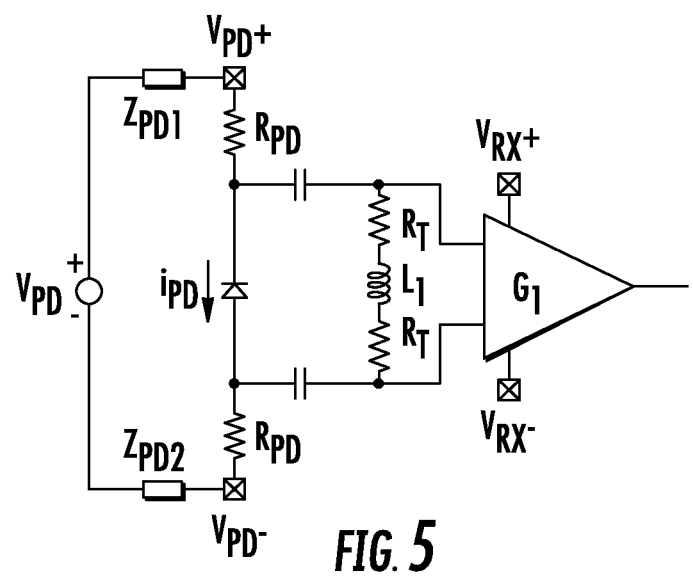
FIG. 5 shows an alternative sample embodiment of the circuit of the differential, open-loop configuration TIA of this invention.

According to an alternative embodiment shown in FIG. 5, a differential peaking inductor L1 is added in series to the two resistances RT to increase the BW.

The specific characteristics of the differential, open-loop configuration TIA are described herein below.

In the fully-differential topology, no single-ended signal path is encountered by the PD generated photocurrent, which follows a differential path also through the two RT trans-resistances, before being converted into a differential voltage. This is useful at frequencies in the range of tens of GHz in order to force the current to flow only through well characterized paths. At the same time, this reduces the sensitivity of the receiver to the PD supply noise.

Any asymmetry in the values of the two resistances RT has negligible impact on the balanced behavior of the circuit because the two resistances RT are in series with each other on a differential path.

Through a direct access to the midpoint of the 2RT series (or of 2RT+L1 series) that is to a midpoint tap, the circuit topology allows a very simple implementation of ESD protection, that may be useful if the PD is not integrated on the same die of the TIA. This may be achieved without penalizing the BW, since the midpoint is a common-mode node and thus can be loaded with an arbitrarily large capacitance without any impact on the BW of the differential signal.

A midpoint tap can be also advantageously used to bias the input stage of the following amplifying stage, e.g. of the input differential pair (or pseudo-differential pair) of transistors.

If there is no need to use differential inductors, L1 may even be split into two separate inductors and the relative position of resistances and inductors in the RT-L1-RT branch can be exchanged.

A programmable equalization operation can be performed simultaneously with the trans-impedance operation by combining the peaking inductor with programmable resistances RT. In the topology, the TIA may remain perfectly balanced even in the presence of active components implementing the programmable resistances (both in case of digital programming, e.g. using switched MOS transistors, and in case of analog programming, e.g. using MOS transistors operating in the triode region), because these active components can be symmetrically biased thanks to the symmetric connection of the resistances RT. For example, in a CMOS implementation, NMOS (or PMOS) transistors can be used in both branches, thus reducing mismatches between the two branches over PVT.

This allows a more flexible approach to equalization, that may contemplate different split options among the amplifying stages, thus optimizing overall performance. In particular, the amount of programmable equalization required in successive amplifying stages may be significantly reduced, thus making multistage equalization more efficient.

Overall performance of the topology can be enhanced by adding a DC control loop around the PD, adapted to precisely set the PD reverse bias voltage to the desired value. This reduces the variation of the PD reverse bias voltage that may be caused by changing operating conditions.

The topology may be suitable for fully-differential, balanced circuit applications, and particularly for silicon photonics applications. Moreover, similar embodiments can be realized also in differential and pseudo-differential topologies.

That which is claimed is:

1. A differential trans-impedance amplifier circuit comprising:
    an amplifier having a pair of input nodes and configured to generate an amplified replica of a differential voltage on said pair of input nodes;
    a photodiode;
    a pair of DC-blocking capacitors coupling said photodiode to said pair of input nodes;
    at least one trans-resistance coupled between said pair of input nodes of said amplifier; and
    a bias network comprising two identical photodiode biasing resistances each greater than said at least one trans-resistance each photodiode biasing resistance coupled in series between said photodiode and a respective DC voltage.

2. The differential trans-impedance amplifier circuit of claim 1, wherein said at least one trans-resistance comprises a pair of trans-resistances.

3. The differential trans-impedance amplifier circuit of claim 1, wherein said pair of identical trans-resistances comprises a pair of identical trans-resistances.

4. The differential trans-impedance amplifier circuit of claim 2, wherein each of said pair of trans-resistances is coupled to a respective one of said input nodes of said amplifier.

5. The differential trans-impedance amplifier circuit of claim 2, further comprising at least one peaking inductor coupled in series between said pair of trans-resistances.

6. The differential trans-impedance amplifier circuit of claim 5, wherein said at least one peaking inductor comprises a midpoint tap.

7. The differential trans-impedance amplifier circuit of claim 6, further comprising at least one electrostatic protection device coupled to said midpoint tap.

8. The differential trans-impedance amplifier circuit of claim 5, wherein said at least one peaking inductor comprises a pair thereof coupled in series, and defining a midpoint tap therebetween.

9. The differential trans-impedance amplifier circuit of claim 8, further comprising at least one electrostatic protection device coupled to said midpoint tap.

10. The differential trans-impedance amplifier circuit of claim 1, wherein said at least one said trans-resistance has a programmable value.

11. The differential trans-impedance amplifier circuit of claim 1, further comprising a control loop configured to maintain a constant reverse bias voltage on said photodiode upon changing operating conditions.

12. An electronic device comprising:
an amplifier having a pair of input nodes and configured to generate an amplified replica of a voltage on said pair of input nodes;
a photodiode;
a pair of DC-blocking capacitors coupling said photodiode to said pair of input nodes;
at least one trans-resistance coupled between said pair of input nodes of said amplifier; and
a bias network comprising two photodiode biasing resistances each greater than said at least one trans-resistance each photodiode biasing resistance coupled in series between said photodiode and a respective voltage.

13. The electronic device of claim 12, wherein said at least one trans-resistance comprises a pair of trans-resistances.

14. The electronic device of claim 13, wherein said pair of identical trans-resistances comprises a pair of identical trans-resistances.

15. The electronic device of claim 13, wherein each of said pair of trans-resistances is coupled to a respective one of said input nodes of said amplifier.

16. The electronic device of claim 13, further comprising at least one peaking inductor coupled in series between said pair of trans-resistances.

17. The electronic device of claim 16, wherein said at least one peaking inductor comprises a midpoint tap.

18. The electronic device of claim 17, further comprising at least one electrostatic protection device coupled to said midpoint tap.

19. The electronic device of claim 16, wherein said at least one peaking inductor comprises a pair thereof coupled in series, and defining a midpoint tap therebetween.

20. The electronic device of claim 19, further comprising at least one electrostatic protection device coupled to said midpoint tap.

21. The electronic device of claim 12, wherein said at least one said trans-resistance has a programmable value.

22. The electronic device of claim 12, further comprising a control loop configured to maintain a constant reverse bias voltage on said photodiode upon changing operating conditions.

23. A method comprising:
generating an amplified replica of a voltage on a pair of input nodes of an amplifier coupled to a photodiode via a pair of DC-blocking capacitors, with at least one trans-resistance coupled between the pair of input nodes of the amplifier; and
reverse biasing the photodiode using a bias network comprising two photodiode biasing resistances each greater than the at least one trans-resistance, each photodiode biasing resistance coupled in series between the photodiode and a respective voltage.

24. The method of claim 23, wherein the at least one trans-resistance comprises a pair of trans-resistances.

25. The method of claim 24, wherein the pair of identical trans-resistances comprises a pair of identical trans-resistances.

26. The method of claim 23, wherein each of the pair of trans-resistances is coupled to a respective one of the input nodes of the amplifier.

27. The method of claim 23, wherein the at least one the trans-resistance has a programmable value.

28. The method of claim 23, further comprising maintaining a constant reverse bias voltage on the photodiode upon changing operating conditions.

* * * * *